United States Patent
Higushi et al.

(10) Patent No.: US 9,209,295 B2
(45) Date of Patent: Dec. 8, 2015

(54) SEMICONDUCTOR MEMORY DEVICE AND METHOD FOR MANUFACTURING THE SAME

(75) Inventors: Masaaki Higushi, Mie-ken (KP); Atsushi Fukumoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 13/601,156

(22) Filed: Aug. 31, 2012

(65) Prior Publication Data

US 2013/0228853 A1 Sep. 5, 2013

(30) Foreign Application Priority Data

Dec. 6, 2011 (JP) ................. 2011-266996

(51) Int. Cl.
*H01L 27/115* (2006.01)
*H01L 29/78* (2006.01)
*H01L 21/28* (2006.01)

(52) U.S. Cl.
CPC ...... *H01L 29/7827* (2013.01); *H01L 21/28008* (2013.01); *H01L 27/11582* (2013.01); *H01L 27/11578* (2013.01)

(58) Field of Classification Search
None
See application file for complete search history.

(56) References Cited

U.S. PATENT DOCUMENTS

| 2007/0252201 A1 | 11/2007 | Kito et al. |
| 2010/0207190 A1 | 8/2010 | Katsumata et al. |
| 2010/0207195 A1 | 8/2010 | Fukuzumi et al. |
| 2010/0327340 A1 | 12/2010 | Oota et al. |
| 2011/0018052 A1 | 1/2011 | Fujiwara et al. |
| 2011/0057249 A1 | 3/2011 | Nakao et al. |
| 2011/0147824 A1* | 6/2011 | Son et al. .............. 257/324 |

FOREIGN PATENT DOCUMENTS

| JP | 2007-266143 A | 10/2007 |
| JP | 2009-146954 A | 7/2009 |
| JP | 2010-192531 A | 9/2010 |
| JP | 2011-9409 A | 1/2011 |
| JP | 2011-23586 A | 2/2011 |
| JP | 2011-29234 A | 2/2011 |
| JP | 2011-60991 A | 3/2011 |
| JP | 2011-66348 A | 3/2011 |

* cited by examiner

*Primary Examiner* — Evan Pert
*Assistant Examiner* — Leslie Pilar Cruz
(74) *Attorney, Agent, or Firm* — Oblon, McClelland, Maier & Neustadt, L.L.P.

(57) ABSTRACT

According to one embodiment, a semiconductor memory device includes: a substrate; a stacked body including a plurality of electrode layers and a plurality of insulating layers, both of them being alternately stacked on the substrate; a cap film provided in contact with the electrode layer within a hole formed to penetrate the stacked body; an insulating film provided on a side wall of the cap film and including a charge accumulation film; and a channel body provided on a side wall of the insulating film. The cap film includes a protrusion portion protruding toward the insulating film. In the cap film, a film thickness of a portion where the protrusion portion is provided in a direction in which the protrusion portion protrudes is larger than a film thickness of the other portions where the protrusion portion is not provided.

10 Claims, 11 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-266996, filed on Dec. 6, 2011; the entire contents of which are incorporated herein by reference.

FIELD

Embodiments described herein relate generally to a semiconductor memory device and a method for manufacturing the same.

BACKGROUND

A three-dimensionally structured memory device is proposed in which a memory hole is formed in a stacked body where a plurality of electrode layers functioning as a control gate in a memory cell and insulating layers are alternately stacked, and in which a silicon body serving as a channel through a charge accumulation film is provided on a side wall of the memory hole.

In the three-dimensionally structured memory device described above, there is a concern that an electric field is concentrated in part (for example, a corner portion) of the electrode layer, and thus the endurance (repeated rewrite) characteristic is degraded.

DETAILED DESCRIPTION

Figure 1:
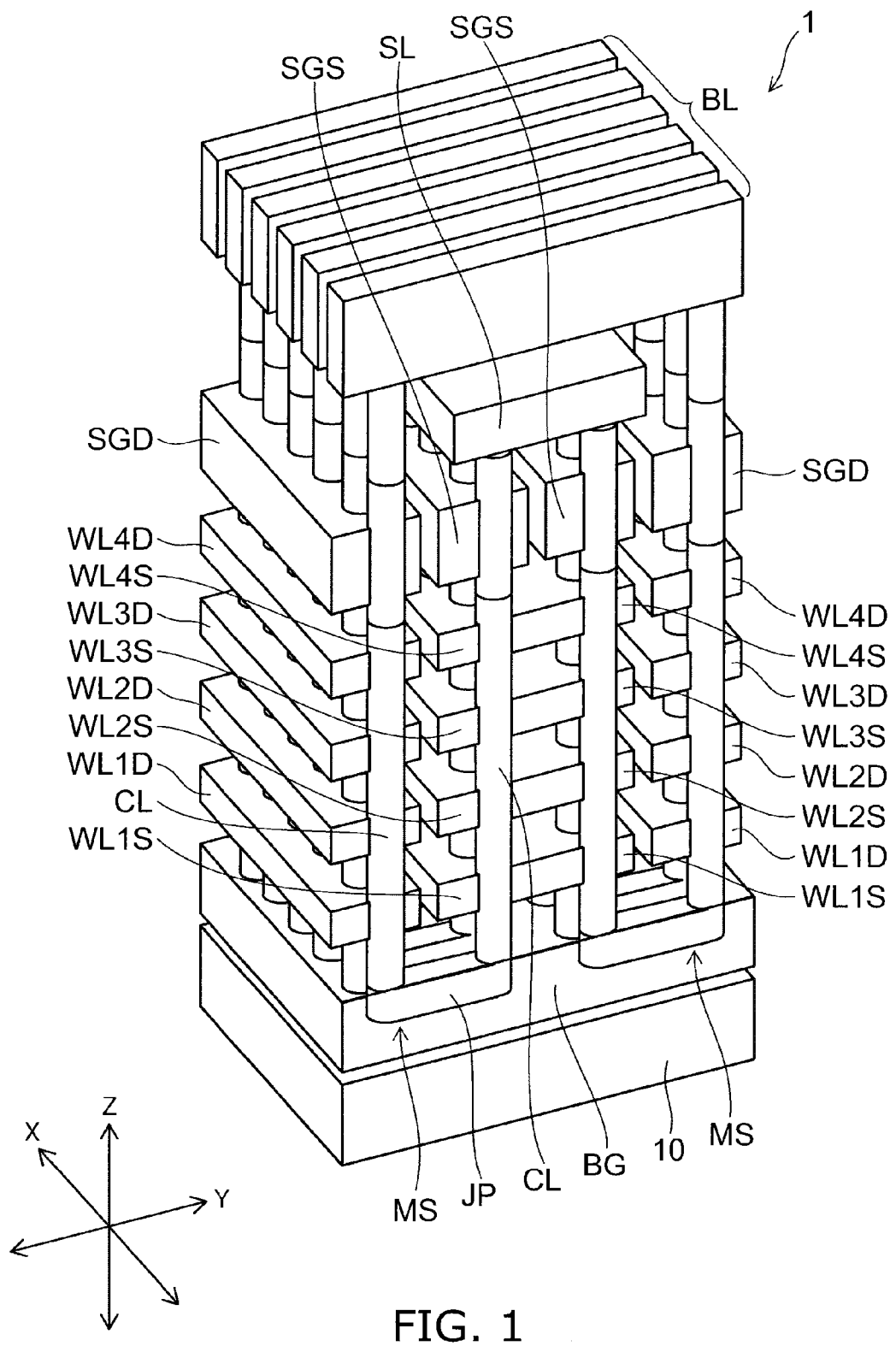
FIG. 1 is a schematic perspective view of a memory cell array 1 in a semiconductor memory device of the embodiment.

In general, according to one embodiment, a semiconductor memory device includes: a substrate; a stacked body including a plurality of electrode layers and a plurality of insulating layers, both of them being alternately stacked on the substrate; a cap film provided in contact with the electrode layer within a hole formed to penetrate the stacked body; an insulating film provided on a side wall of the cap film and including a charge accumulation film; and a channel body provided on a side wall of the insulating film. The cap film includes a protrusion portion protruding toward the insulating film. In the cap film, a film thickness of a portion where the protrusion portion is provided in a direction in which the protrusion portion protrudes is larger than a film thickness of the other portions where the protrusion portion is not provided.

According to another embodiment, a semiconductor memory device includes: a substrate; a stacked body including a plurality of electrode layers and a plurality of insulating layers, both of them being alternately stacked on the substrate; a cap film provided in contact with the electrode layer within a hole formed to penetrate the stacked body; an insulating film provided on a side wall of the cap film and including a charge accumulation film; and a channel body provided on a side wall of the insulating film. The electrode layer includes a corner portion continuous to an end portion in a direction of thickness. The cap film includes a corner portion covering the corner portion of the electrode layer. A curvature of the corner portion of the electrode layer is lower than a curvature of the corner portion of the cap film. A film thickness of the corner portion of the cap film is larger than a film thickness of portions other than the corner portion of the cap film.

According to another embodiment, a method of manufacturing a semiconductor memory device includes: stacking a plurality of electrode layers on a substrate; forming a hole penetrating the electrode layers in a direction of stacking of the plurality of electrode layers; and introducing a reactive species of the electrode layers into a side wall on a side of the hole in the electrode layers and a corner portion continuous to the side wall and forming a cap film on the side wall and the corner portion such that a film thickness of the cap film is larger in the corner portion than in the side wall.

Embodiments of the invention will now be described with reference to the drawings. In the drawings, the same components are marked with like reference numerals.

FIG. 1 is a schematic perspective view of a memory cell array 1 in a semiconductor memory device of the embodiment. In FIG. 1, in order for the figure to be made visible, an insulating portion is not illustrated.

In FIG. 1, for ease of description, an XYZ orthogonal coordinate system is introduced. In this coordinate system, two directions that are parallel to the major surface of a substrate 10 and that are perpendicular to each other are referred to as an X direction and a Y direction, and a direction perpendicular to both the X direction and the Y direction is referred to as a Z direction.

Figure 6A:
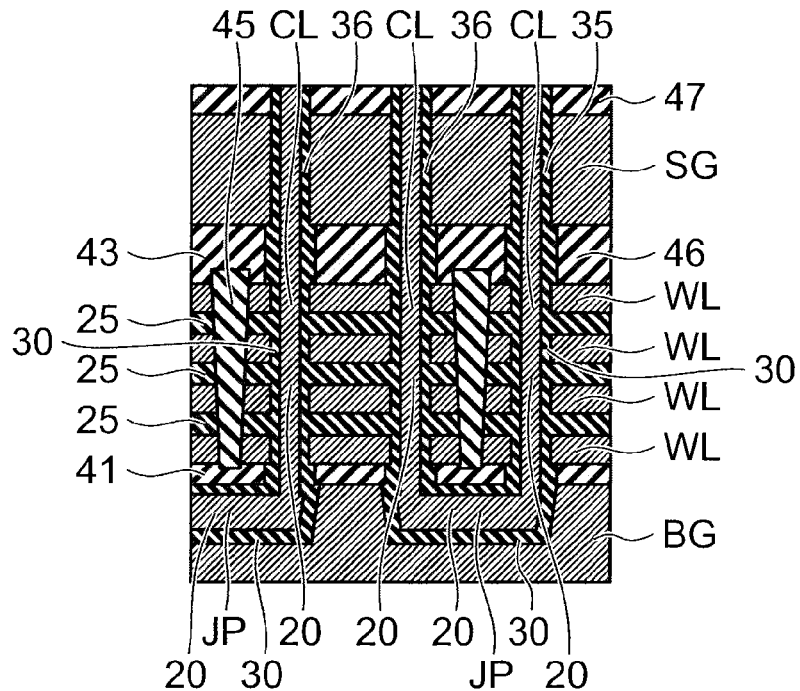
Figure 6B:
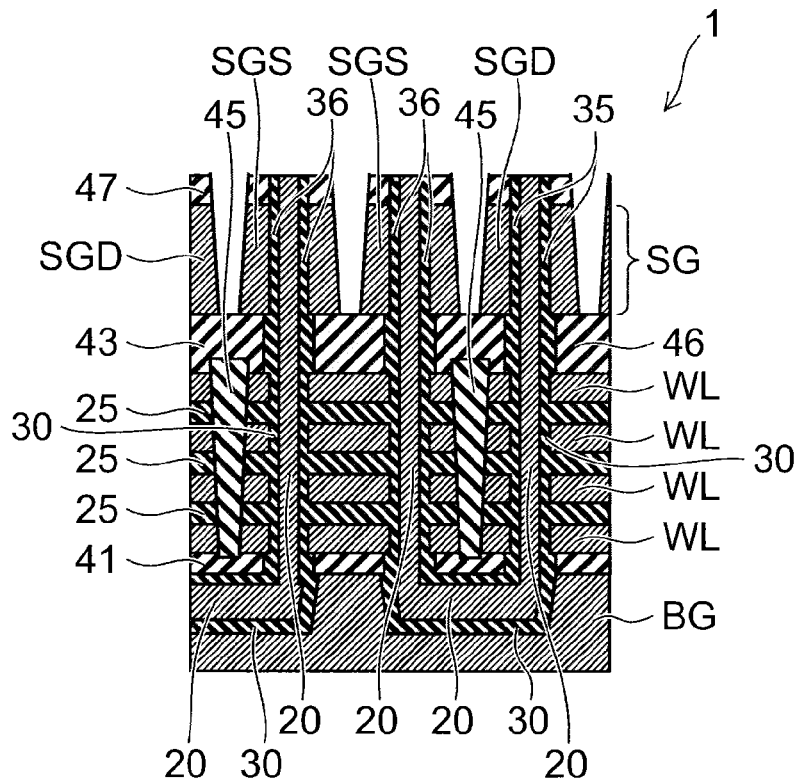

FIG. 6B is a schematic cross-sectional view of the memory cell array 1.

Electrode layers represented in FIG. 1 by reference numerals WL1D, WL2D, WL3D, WL4D, WL1S, WL2S, WL3S and WL4S are not individually represented in the other drawings, and are simply represented by an electrode layer WL.

On the substrate 10, through an insulating layer 11 (shown in FIG. 3A), a back gate BG is provided. As the back gate BG, for example, a silicon layer to which an impurity is added and is conductive can be used.

In FIG. 6B, the substrate 10 is not shown, and the back gate BG and components on the back gate BG are shown.

On the back gate BG, as shown in FIG. 6B, an insulating layer 41 is provided. On the insulating layer 41, a stacked body including a plurality of electrode layers WL and a plurality of insulating layers 25 is provided. The electrode layers WL and the insulating layers 25 are alternately stacked. The number of layers in the electrode layers WL is arbitrary; it is not limited to four.

In FIG. 1, the electrode layer WL1D and the electrode layer WL1S are provided in the same layer, and are the first electrode layer from the bottom (from the side of the substrate 10). The electrode layer WL2D and the electrode layer WL2S are provided in the same layer, and are the second electrode layer from the bottom. The electrode layer WL3D and the electrode layer WL3S are provided in the same layer, and are the third electrode layer from the bottom. The electrode layer WL4D and the electrode layer WL4S are provided in the same layer, and are the fourth electrode layer from the bottom.

The electrode layer WL1D and the electrode layer WL1S are separated in the Y direction. The electrode layer WL2D and the electrode layer WL2S are separated in the Y direction. The electrode layer WL3D and the electrode layer WL3S are separated in the Y direction. The electrode layer WL4D and the electrode layer WL4S are separated in the Y direction.

Insulating films 45 shown in FIG. 6B are provided between the electrode layer WL1D and the electrode layer WL1S, between the electrode layer WL2D and the electrode layer WL2S, between the electrode layer WL3D and the electrode layer WL3S and between the electrode layer WL4D and the electrode layer WL4S.

The electrode layers WL1D to WL4D are provided between the back gate BG and a drain side selection gate SGD. The electrode layers WL1S to WL4S are provided between the back gate BG and a source side selection gate SGS.

As the electrode layers WL, for example, a silicon layer to which an impurity is added and is conductive can be used. As the insulating layers 25, for example, an insulating material including a silicon oxide can be used.

On the electrode layer WL4D, the drain side selection gate SGD is provided. As the drain side selection gate SGD, for example, a silicon layer to which an impurity is added and is conductive can be used.

On the electrode layer WL4S, the source side selection gate SGS is provided. As the source side selection gate SGS, for example, a silicon layer to which an impurity is added and is conductive can be used.

The drain side selection gate SGD and the source side selection gate SGS are separated in the Y direction. In the following description, the drain side selection gate SGD and the source side selection gate SGS may not be distinguished and be simply referred to a selection gate SG.

On the source side selection gate SGS, a source line SL is provided. As the source line SL, for example, a metal layer can be used.

On the drain side selection gate SGD and the source line SL, bit lines BL that are a plurality of metal wirings are provided. Each of bit lines BL extents in the Y direction.

Figure 5A:
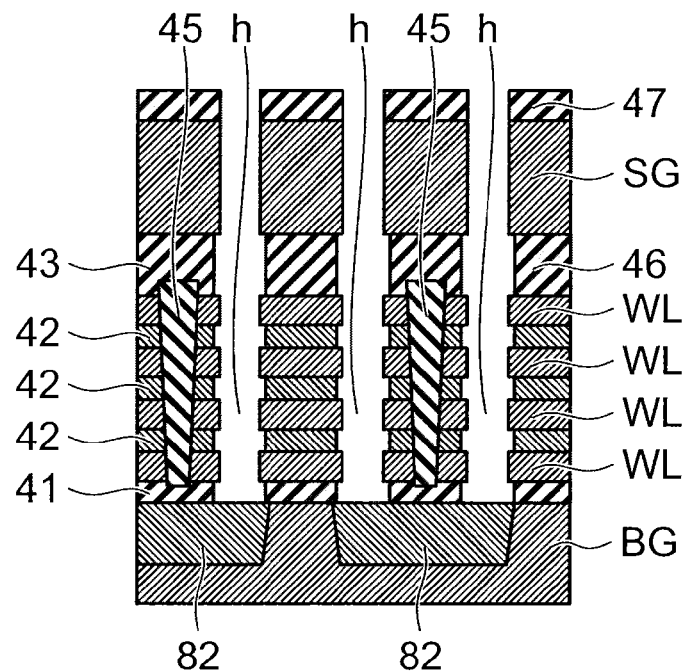
Figure 5B:
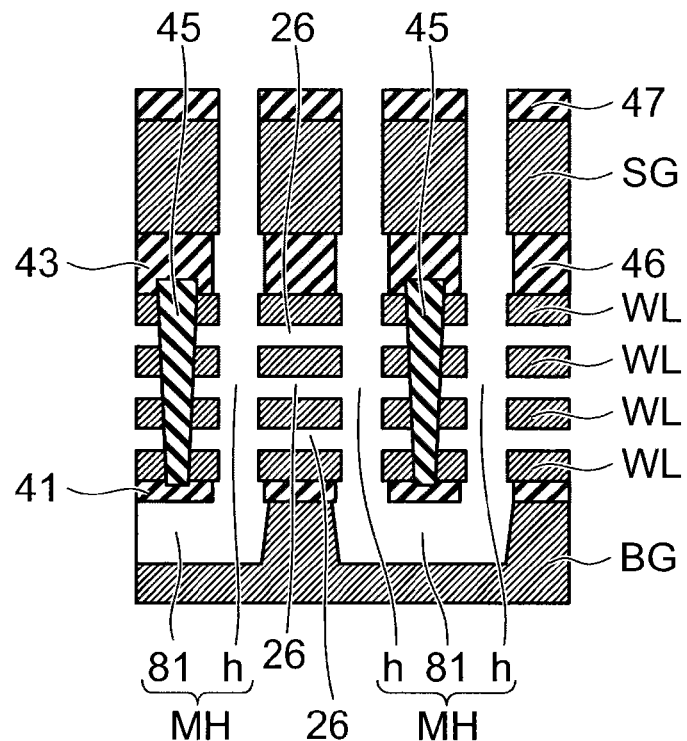

In the back gate BG and the stacked body on the back gate BG, a plurality of U-shaped memory holes MH shown in FIG. 5B are formed. In the drain side selection gate SGD and the electrode layers WL (the electrode layers WL1D to WL4D in FIG. 1) stacked below them, holes h that penetrate them and extend in the Z direction are formed. In the source side selection gate SGS and the electrode layers WL (the electrode layers WL1S to WL4S in FIG. 1) stacked below them, holes h that penetrate them and extend in the Z direction are formed. The pair of holes h extending in the Z direction are connected through grooves 81 formed within the back gate BG, and constitute the U-shaped memory holes MH.

Within the memory holes MH, channel bodies 20 shown in FIG. 6B are provided. As the channel bodies 20, for example, a silicon film can be used. Between the channel bodies 20 and the inner walls of the memory holes MH, insulating films 30 including a cap film, a block film, a charge accumulation film and a tunnel film, which will be described later, are provided.

As shown in FIG. 6B, between the drain side selection gate SGD and the channel bodies 20, gate insulating films 35 are provided, and between the source side selection gate SGS and the channel bodies 20, gate insulating films 36 are provided.

First Embodiment

Figure 2A:
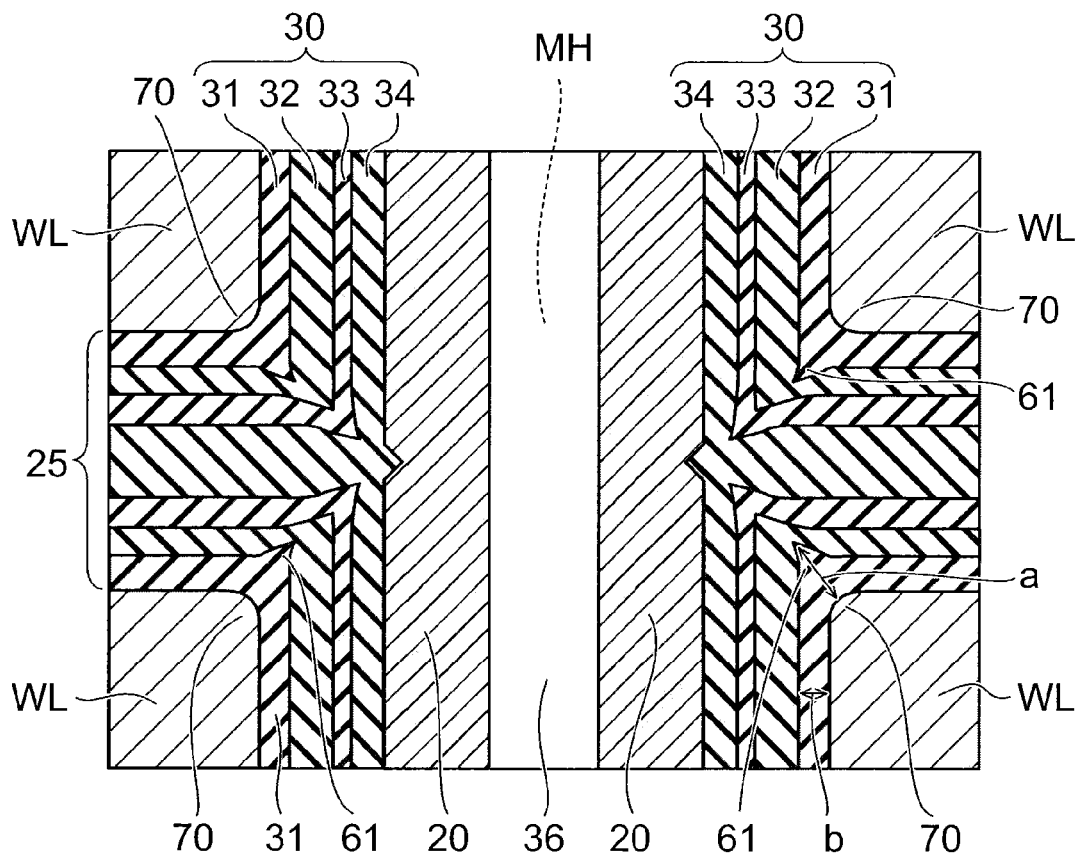
FIG. 2A is a schematic cross-sectional view of a memory cell according to a first embodiment.
Figure 2B:
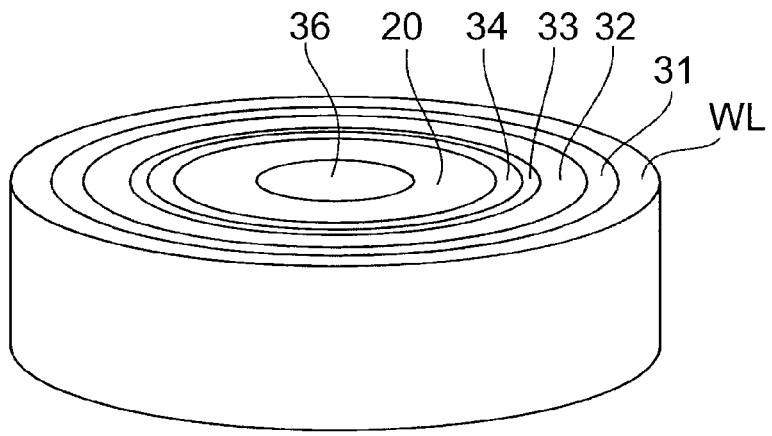
FIG. 2B is a schematic perspective view of the memory cell.

FIG. 2A is a schematic cross-sectional view of a memory cell according to a first embodiment; FIG. 2B is a schematic perspective view of the memory cell.

Between the individual electrode layers WL and the channel bodies 20 in the memory cell, the cap film 31, the block film 32, the charge accumulation film 33 and the tunnel film 34 are provided in this order from the side of the electrode layers WL.

Between the electrode layers WL adjacent in the direction in which they are stacked, the cap film 31, the block film 32, the charge accumulation film 33 and the tunnel film 34 are provided in this order from the side of the electrode layers WL; these stacked films correspond to the insulating layers 25 of FIG. 6B. The insulating layers 25 may have a single-layer structure.

The cap film 31 is connected to the electrode layer WL. Specifically, as described later, the surface of the electrode layer WL, which is a silicon layer, is nitrided, and thus a silicon nitride film is formed as the cap film 31.

On the side wall on the side of the center axis of the memory hole MH in the cap film 31, the block film 32 is provided. On the side wall on the side of the center axis of the memory hole MH in the block film 32, the charge accumulation film 33 is provided. On the side wall on the side of the center axis of the memory hole MH in the charge accumulation film 33, the tunnel film 34 is provided. On the side wall on the side of the center axis of the memory hole MH in the tunnel film 34, the channel body 20 is provided; the tunnel film 34 is connected to the channel body 20.

Inside the channel body 20 within the memory hole MH, the insulating body 36 is provided. The insulating body 36 is, for example, a silicon oxide film, a silicon oxynitride film or a hole.

As shown in FIG. 2B, the insulating body 36 is cylindrically surrounded by the channel body 20, the channel body 20 is cylindrically surrounded by the tunnel film 34, the tunnel film 34 is cylindrically surrounded by the charge accumulation film 33, the charge accumulation film 33 is cylindrically surrounded by the block film 32, the block film 32 is cylindrically surrounded by the cap film 31 and the cap film 31 is cylindrically surrounded by the electrode layer WL.

The channel body 20 functions as a channel of the memory cell, the electrode layer WL functions as a control gate and the charge accumulation film 33 functions as a data storage layer in which charge injected from the channel body 20 is accumulated. In a portion where the channel body 20 intersects each electrode layer WL, the memory cell having a structure in which the control gate surrounds the channel is formed.

The semiconductor memory device of the embodiment is a nonvolatile semiconductor memory device that can electrically freely delete and write data and that can hold the content of storage even if power is turned off.

The memory cell is, for example, a charge trap type memory cell. The charge accumulation film 33 has a large number of trap sites that capture charge; for example, a silicon nitride film or a silicon oxynitride film can be used.

As the tunnel film 34, for example, a silicon oxide film or a silicon oxynitride film can be used; the tunnel film 34 serves as a potential barrier when charge is injected from the channel body 20 into the charge accumulation film 33 or when charge accumulated in the charge accumulation film 33 is diffused into the channel bodies 20.

The block film 32 and the cap film 31 prevent the diffusion of the charge accumulated in the charge accumulation film 33 into the electrode layer WL.

As the block film 32, for example, an aluminum oxide (alumina) film, a silicon oxide film or a silicon oxynitride film can be used.

As the cap film 31, a film that has a higher nitrogen concentration than the block film 32 is used; the cap film 31 blocks charge against the electrode layer WL more than the block film 32. As the cap film 31, for example, a silicon nitride film, a silicon oxide film or a silicon oxynitride film can be used. Among them, a silicon nitride film significantly blocks charge.

As described later, a reactive species with the electrode layer WL is introduced into the electrode layer WL, and thus the cap film 31 is formed. As the reactive species, for example, nitrogen or oxygen can be used. For example, the electrode layer WL, which is a silicon layer, is nitrided, and thus a silicon nitride film is formed as the cap film 31. Alternatively, the electrode layer WL, which is a silicon layer is oxidized, and thus a silicon oxide film is formed as the cap film 31. Alternatively, the electrode layer WL, which is a silicon layer is oxynitrided, and thus a silicon oxynitride film is formed as the cap film 31.

The drain side selection gate SGD, the channel body 20 and the gate insulating film 35 therebetween constitute a drain side selection transistor. The channel body 20 of the drain side selection transistor is connected to the bit line BL.

The source side selection gate SGS, the channel body 20 and the gate insulating film 36 therebetween constitute a source side selection transistor. The channel body 20 of the source side selection transistor is connected to the source line SL.

The back gate BG, the channel body 20 provided within the back gate BG and the insulating film 30 constitute a back gate transistor.

Between the drain side selection transistor and the back gate transistor, a plurality of memory cells in which the electrode layers WL4D to WL1D are used as the control gates are provided. Likewise, between the back gate transistor and the source side selection transistor, a plurality of memory cells in which the electrode layers WL1S to WL4S are used as the control gates are provided.

The plurality of memory cells, the drain side selection transistor, the back gate transistor and the source side selection transistor are connected in series through the channel body 20, and constitute a U-shaped memory string MS.

The memory string MS includes: a pair of columnar portions CL extending in a direction in which the stacked body including a plurality of electrode layers WL is stacked; and a joint portion JP that is embedded in the back gate BG and that connects the lower ends of the pair of columnar portions CL. A plurality of memory strings MS described above are aligned in the X direction and Y direction, and thus a plurality of memory cells are three-dimensionally provided in the X direction, the Y direction and the Z direction.

In the first embodiment, as shown in FIG. 2A, each of the electrode layers WL has a corner portion 70 that is continuous to the end portion of a side wall, in the direction of the thickness (direction of the stacking), facing the memory hole MH. In other words, the corner portion 70 is continuous from the side wall on the side of the memory hole MH of each of the electrode layers WL to the interface with the insulating layer 25.

In a corner portion of the cap film 31 covering the corner portion 70 of the electrode layer WL, a protrusion portion 61 that protrudes to the side of the block film 32 is provided. In the cap film 31, the film thickness a of a portion of the protrusion portion 61, in the direction of the protrusion, where the protrusion portion 61 is provided is more than the film thickness b of the other portions where the protrusion portion 61 is not provided.

The corner portion 70 of the electrode layer WL is formed in the shape of a curved surface; the curvature of the corner portion 70 of the electrode layer WL (the curvature of the interface between the corner portion 70 of the electrode layer WL and the cap film 31) is less than the curvature of the protrusion portion 61 (the curvature of the interface between the protrusion portion 61 and the block film 32).

An electric field is more likely to be concentrated in the protrusion portion 61. Hence, as compared with a case where there is no protrusion portion 61, a high electric field is more likely to be induced in the memory cell, and thus it is possible to perform writing and deletion at a lower voltage and enhance the operation speed of writing and deletion.

The electric field in the corner portion 70 of the electrode layer WL is easily increased as compared with the other portions. Hence, the protrusion portion 61 is provided in the corner portion 70 of the electrode layer WL, and thus an electric field assist effect resulting from the protrusion portion 61 is easily facilitated.

In the cap film 31, the film thickness of the portion where the protrusion portion 61 is provided is more than that of the other portions. The curvature of the corner portion 70 of the electrode layer WL where the protrusion portion 61 is provided is less than that of the protrusion portion 61. Thus, it is possible to reduce the degradation of the portion of the cap film 31 where the protrusion portion 61 is provided, resulting from the excessive concentration of the electric field and to reduce the decrease in the endurance (repeated rewriting) characteristic.

In other words, in the first embodiment, it is possible to enhance the operation speed and reduce the operation voltage and to provide a highly reliable semiconductor memory device.

A method of manufacturing a memory array in the semiconductor memory device of the first embodiment will now be described with reference to FIGS. 3A to 8B.

Figure 3A:
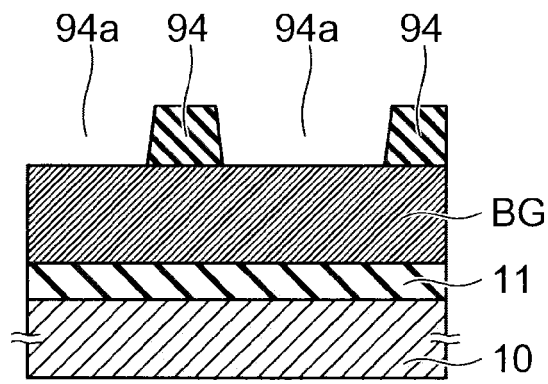
FIGS. 3A to 8B are schematic views showing a method of manufacturing a memory array in the semiconductor memory device of the first embodiment.

As shown in FIG. 3A, the back gate BG is provided on the substrate 10 through an insulating layer 11. In the process cross-sectional views of FIG. 3B and the following figures, the substrate 10 and the insulating layer 11 are not shown.

A resist 94 is formed on the back gate BG. The resist 94 is patterned, and thus openings 94a are selectively formed in the resist 94.

Figure 3B:
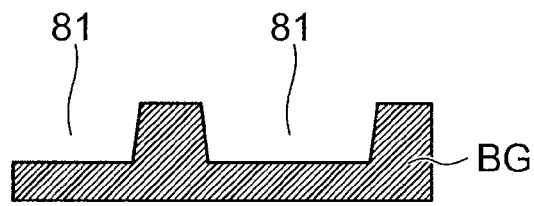

The resist 94 is masked, and the back gate BG is selectively dry etched. Thus, as shown in FIG. 3B, grooves (or concave portions) 81 are formed in the back gate BG.

Figure 3C:
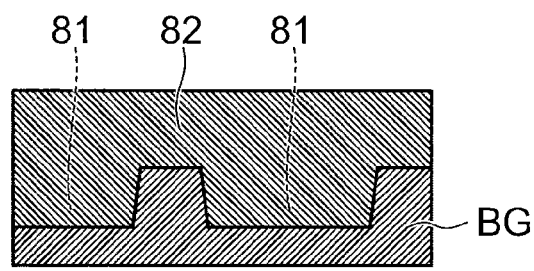
Figure 3D:
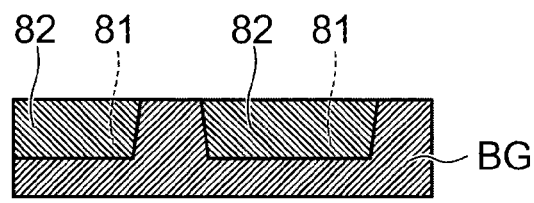

As shown in FIG. 3C, a sacrifice film 82 is embedded within the grooves 81. As the sacrifice film 82, a material that has an etching selectivity with the back gate BG is used. Thereafter, the sacrifice film 82 is subjected to overall etching, and thus the upper surface of the back gate BG between the grooves 81 is exposed as shown in FIG. 3D.

Figure 4A:
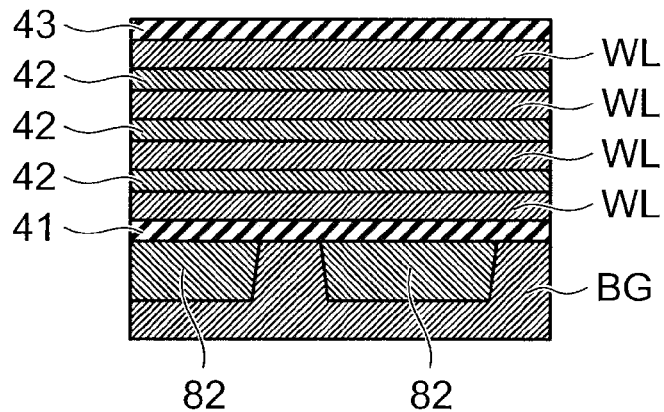

On the back gate BG and the sacrifice film 82, as shown in FIG. 4A, the insulating layer 41 is formed; on the insulating layer 41, the electrode layer WL and a non-doped silicon layer 42 are alternately stacked a plurality of times.

The electrode layer WL is a silicon layer to which an impurity is added and which is conductive. The non-doped silicon layer 42 formed between the electrode layers WL functions as the sacrifice film that is finally replaced with the insulating layer 25 shown in FIGS. 6A and 6B in a process described later. An insulating layer 43 is formed on the uppermost electrode layer WL.

Figure 4B:
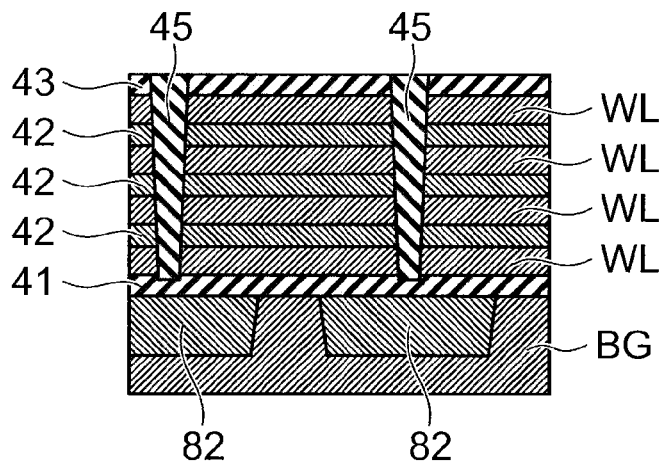

Grooves that reach the insulating layer 41 are formed in the stacked body. The grooves are formed on the sacrifice film 82. The insulating films 45 shown in FIG. 4B are embedded within the grooves.

Figure 4C:
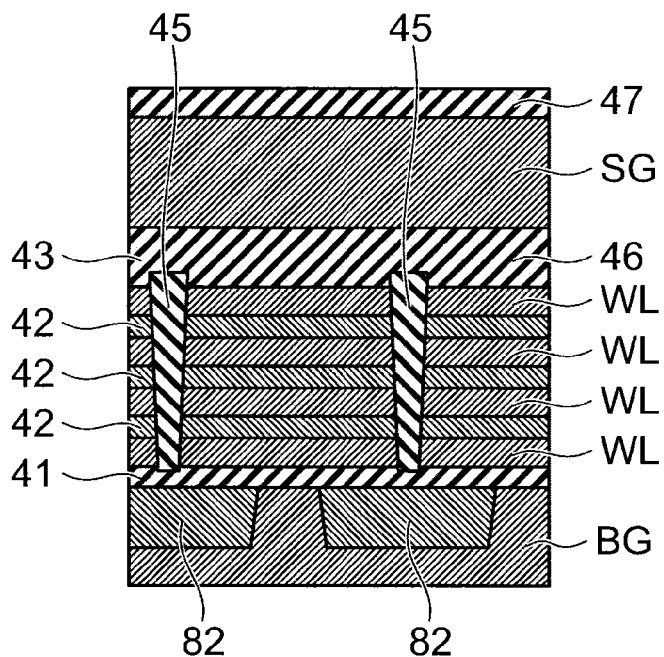

The insulating films 45 are embedded in the grooves, and then the uppermost insulating layer 43 of the stacked body is exposed by overall etching. On the insulating layer 43, as shown in FIG. 4C, an insulating layer 46 is formed. Furthermore, the selection gate SG is formed on the insulating layer 46, and an insulating layer 47 is formed on the selection gate SG.

Thereafter, as shown in FIG. 5A, in the stacked body on the back gate BG, holes h are formed. The holes h are formed by, for example, a reactive ion etching (RIE) method using an unillustrated mask. The lower ends of the holes h reach the sacrifice films 82, and the sacrifice films 82a are exposed to the bottom portions of the holes h.

After the formation of the holes h, the sacrifice films 82 are removed by, for example, wet etching. Thus, the sacrifice films 82 are removed as shown in FIG. 5B. The non-doped silicon layers 42 between the electrode layers WL are also removed through the holes h, and spaces 26 are formed between the electrode layers WL. The sacrifice films 82 and the non-doped silicon layers 42 can be removed simultaneously in the same etching process or can be removed in different etching processes.

The back gate BG, the electrode layer WL and the selection gate SG are made of materials different from those of the sacrifice film 82 and the non-doped silicon layer 42, and are not removed when the etching described above is performed.

As shown in FIG. 5B, the grooves 81 are formed in the back gate BG by the removal of the sacrifice films 82. The lower ends of a pair of holes h are connected to one groove 81. In other words, each of the lower ends of the pair of holes h are connected to one common groove 81, and thus one U-shaped memory hole MH is formed.

After the formation of the memory holes MH, as shown in FIG. 6A, the insulating layers 25 are formed between the electrode layers WL, and furthermore, the insulating films 30 described above are formed on the inner walls of the memory holes MH.

In the first embodiment, the protrusion portion 61 is formed on the cap film 31; the method of forming it will be described later with reference to FIGS. 7A to 8B.

The gate insulating films 35 and 36 are formed on the side walls of the memory holes MH that are exposed to the selection gate SG.

Furthermore, inside the insulating films 30 and the gate insulating films 35, 36 within the memory holes MH, as the channel bodies 20, silicon films are formed. Thereafter, overall etching is performed to make the surface of the insulating layer 47 exposed.

Then, as shown in FIG. 6B, by photolithograph and etching, grooves that reach the insulating layer 46 are formed in the insulating layer 47 and the selection gate SG. Thus, the selection gate SG is divided into the drain side selection gate SGD and the source side selection gate SGS. Furthermore, the source line SL, the bit line BL and the like shown in FIG. 1 are formed.

The method of forming the protrusion portion 61 of the cap film 31 will now be described.

In the formation of the protrusion portion 61 of the cap film 31, processing for forming the protrusion portion on the electrode layer WL is first performed, and then the protrusion portion on the electrode layer WL is nitrided into the protrusion portion 61 of a silicon nitride film.

Figure 7A:
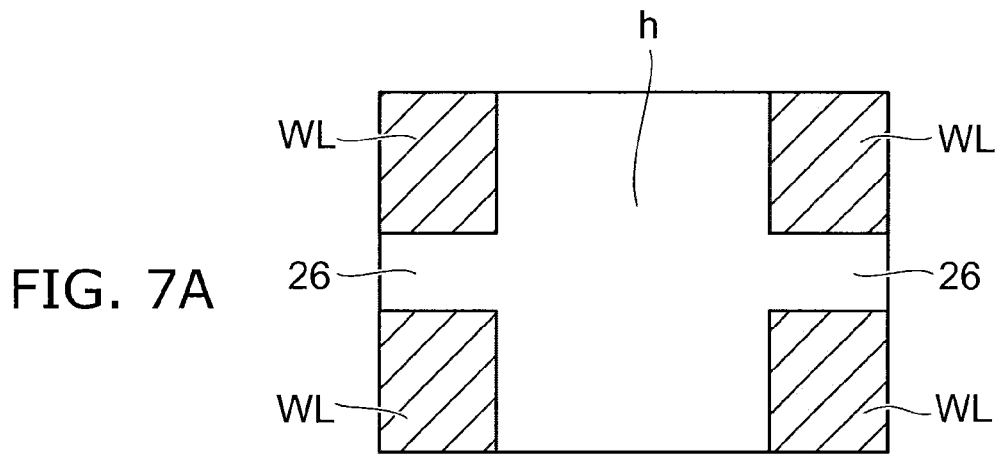

FIG. 7A shows a state where the hole h and the spaces between electrodes 26 have been formed.

Figure 7B:
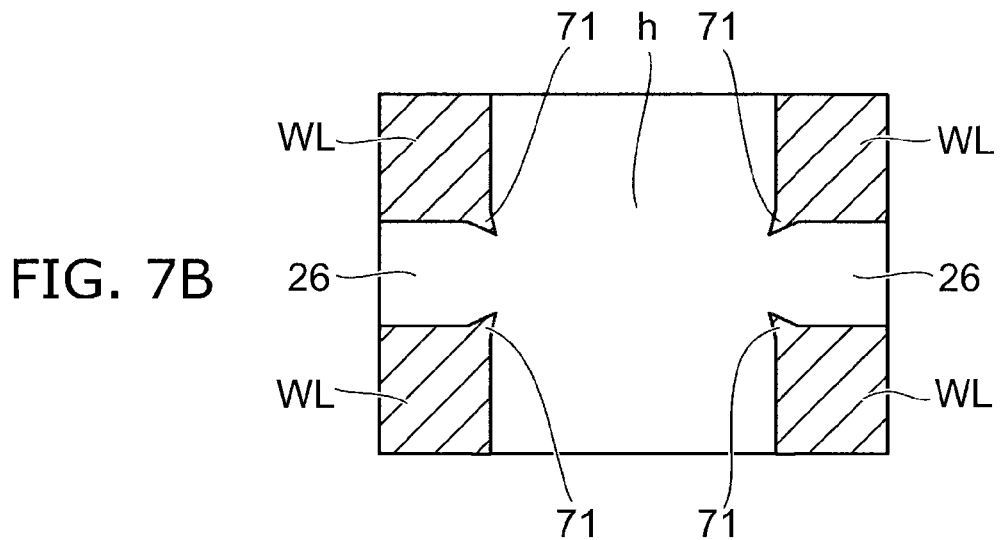

After the formation of the hole h and the spaces between electrodes 26, the electrode layers WL are wet-etched, and thus as shown in FIG. 7B, on the corner portions of the electrode layers WL, protrusion portions 71 of the electrode layers WL that protrude toward the hole h are formed.

As the formation method of the protrusion portions 71, a method utilizing variations in the concentration of an impurity in the electrode layers WL can be used.

When, as the electrode layer WL, a silicon layer containing, for example, boron (B) as an impurity is formed, the concentration of boron in a portion where the protrusion portion 71 is desired to be formed (or a layer including such a portion) is set higher than those in the other portions.

When, in this state, for example, TMY (trimethyl-2-hydroxyethylammonium hydroxide) is used to etch the electrode layer WL, an etching rate in the portion of low boron concentration is higher than that in the portion of high concentration, and thus as shown in FIG. 7B, it is possible to perform control such that the high boron concentration portion is left as the protrusion portion 71.

Figure 7C:
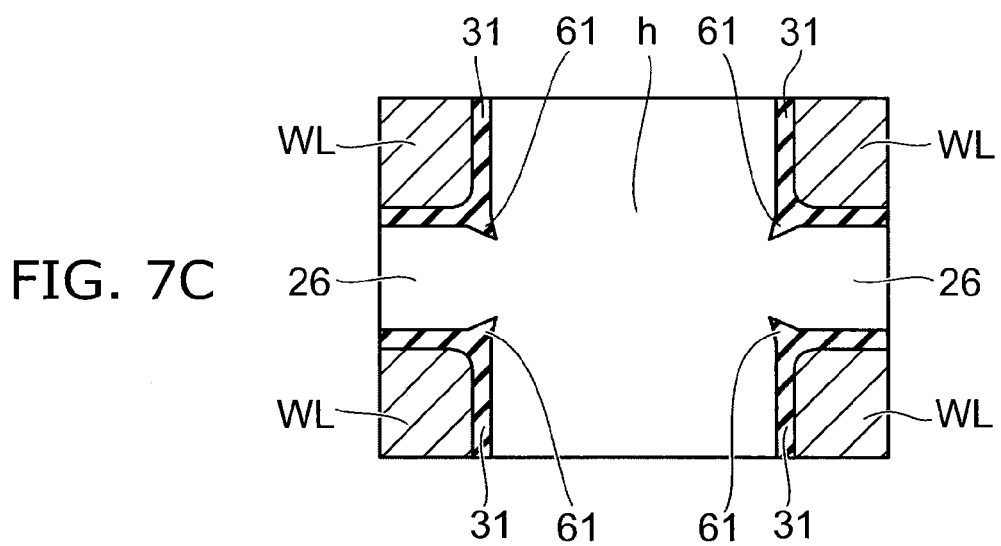

After the formation of the protrusion portion 71 on the electrode layer WL, the exposed surface side of the electrode layer WL, which is a silicon layer, is nitrided, and as shown in FIG. 7C, in the exposed surface side, the cap film 31 that is a silicon nitride film is formed.

For example, by introducing a $NH_3$ gas into a processing room and performing, for 10 minutes, processing by a thermal nitridation method of heating the substrate to 1050° C., it is possible to nitride the electrode layer WL.

Alternatively, by introducing the $NH_3$ gas and a gas containing fluorine (for example, a $CF_4$ gas, a $SF_6$ gas or a $NH_6$ gas) into the processing room and performing, for 30 minutes, processing by a plasma nitridation method of heating the substrate to 900° C., it is possible to nitride the electrode layer WL.

Figure 8A:
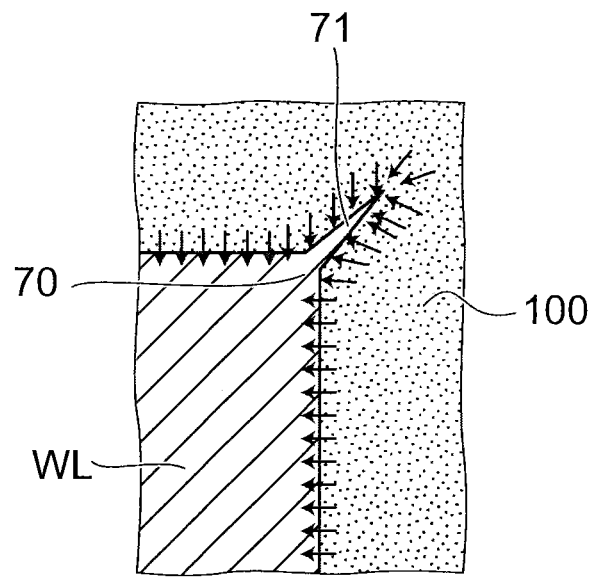
Figure 8B:
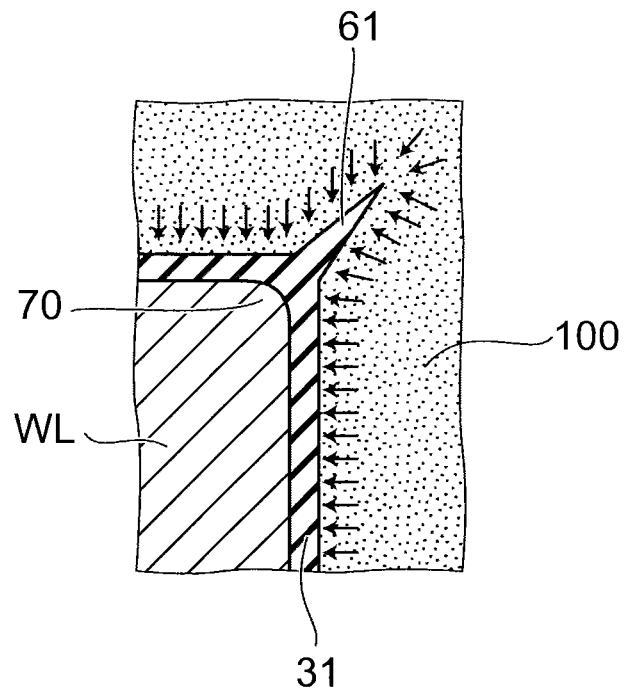

When the electrode layer WL is nitrided, as shown in FIG. 8A, the protrusion portion 71 of the electrode layer WL is isotropically exposed, in a plurality of directions, to a gas 100 containing a nitriding seed (N), and the nitriding reaction proceeds over the entire protrusion portion 71. Consequently, as shown in FIG. 8B, in the cap film 31 formed by the nitriding of the electrode layer WL, the film thickness of the portion where the protrusion portion 61 is provided (a thickness in a direction perpendicular to the interface with the electrode layer WL) can be made larger than the film thickness of the other portions where the protrusion portion 61 is not provided, and thus it is possible to increase the reliability.

The corner portion 70 of the electrode layer WL is also isotropically exposed, in a plurality of directions, to the gas 100 containing the nitriding seed (N). Hence, by appropriately controlling the conditions of the nitriding reaction (such as a time and temperature), it is possible to form the corner portion 70 (the interface between the corner portion 70 and the cap film 31) of the electrode layer WL into the shape of a curved surface.

As another method of forming the protrusion portion 71 on the electrode layer WL, a method of crystallizing the electrode layer WL before the TMY processing can also be used.

The electrode layer WL is formed as, for example, an amorphous silicon layer, and, in such an amorphous silicon state, the process is made to proceed to the step shown in FIG. 7A. Thereafter, for example, by introducing a nitrogen gas (N2 gas) into the processing room and performing, for 30 minutes, processing of heating the substrate to 850° C., the electrode layer WL is polycrystallized.

In the TMY etching for the polycrystalline silicon, the etching rate differs depending on the direction of the crystalline axis of each portion of the polycrystalline silicon, and thus it is possible to form projections and recesses, that is, the protrusion portion on the electrode layer WL.

In this case, it is difficult to control the position where the protrusion portion is formed, and the protrusion portion is not always formed in the corner portion. However, even in a structure where the protrusion portion is formed on the side wall of the electrode layer WL, it is possible to enhance writing and deletion characteristics by the field assist effect utilizing the protrusion portion.

Even when the protrusion portion is formed on the side wall of the electrode layer WL, the nitriding processing described above is performed, and thus it is possible to nitride the entire protrusion portion. Consequently, even in the structure where the protrusion portion is provided on the side wall of the cap film 31, the film thickness of the portion where the protrusion portion is provided on the cap film 31 (a thickness in a direction perpendicular to the interface with the electrode layer WL) can be made larger than the film thickness of the other portions where the protrusion portion is not provided.

Second Embodiment

Figure 9:
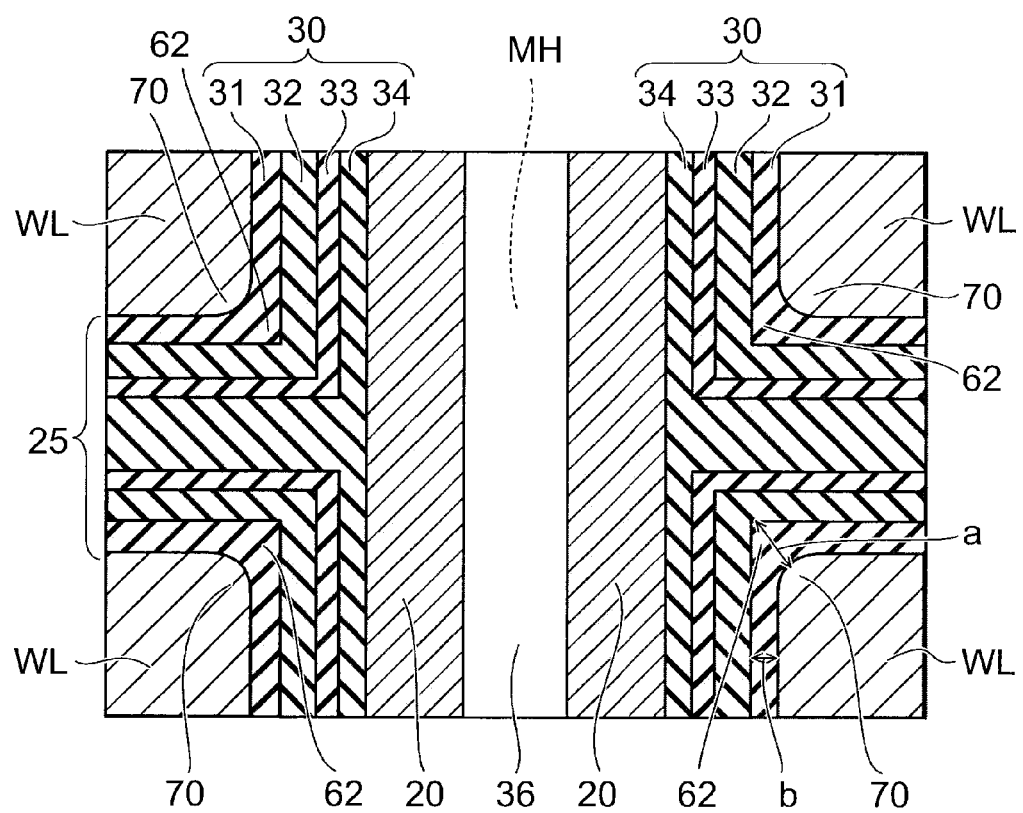
FIG. 9 is a schematic cross-sectional view of a memory cell according to a second embodiment.

FIG. 9 is a schematic cross-sectional view of a memory cell according to a second embodiment.

Even in the memory cell of the second embodiment, between the individual electrode layers WL and the channel bodies 20, the cap film 31, the block film 32, the charge accumulation film 33 and the tunnel film 34 are provided sequentially from the side of the electrode layer WL.

For example, the side of the surface of the electrode layer WL, which is a silicon layer, is nitrided, and thus a silicon nitride film is formed as the cap film 31.

Even in the second embodiment, each of the electrode layers WL has the corner portion 70 that is continuous to the end portion of the side wall, in the direction of the thickness, facing the memory hole MH. In other words, the corner portion 70 is continuous from the side wall on the side of the memory hole MH of each of the electrode layers WL to the interface with the insulating layer 25.

The film thickness a of a corner portion 62 of the cap film 31 covering the corner portion 70 of the electrode layer WL is more than the film thickness b of the portions other than corner portion 62 of the cap film 31.

The corner portion 70 of the electrode layer WL is formed in the shape of a curved surface; the curvature of the corner portion 70 of the electrode layer WL (the curvature of the interface between the corner portion 70 of the electrode layer WL and the cap film 31) is less than the curvature of the protrusion portion 62 of the cap film 31 (the curvature of the interface between the protrusion portion 62 and the block film 32).

It is therefore possible to alleviate the concentration of the electric field into the corner portion 70 of the electrode layer WL and reduce the degradation of the corner portion 62 of the cap film 31. Consequently, it is possible to reduce the decrease in the endurance (repeated rewriting) characteristic and provide a highly reliable semiconductor memory device.

Figure 10A:
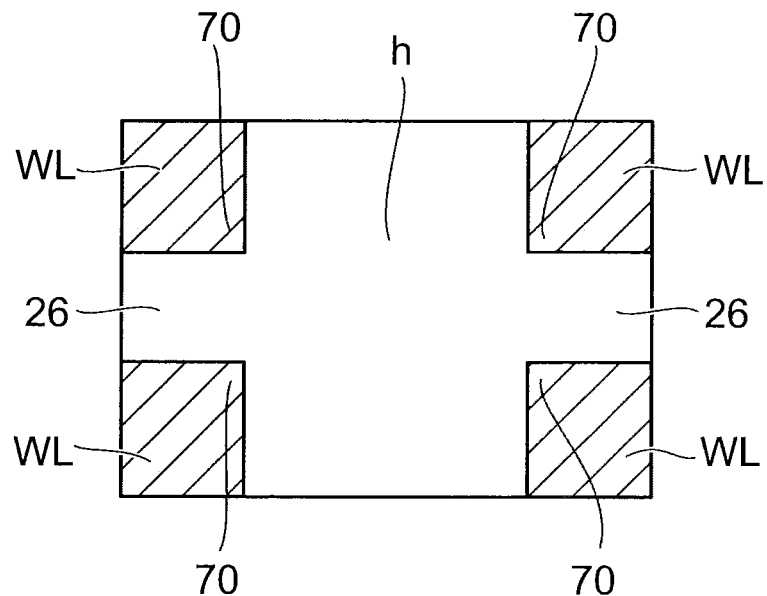
FIGS. 10A and 10B show steps in the formation of the cap film 31.
Figure 10B:
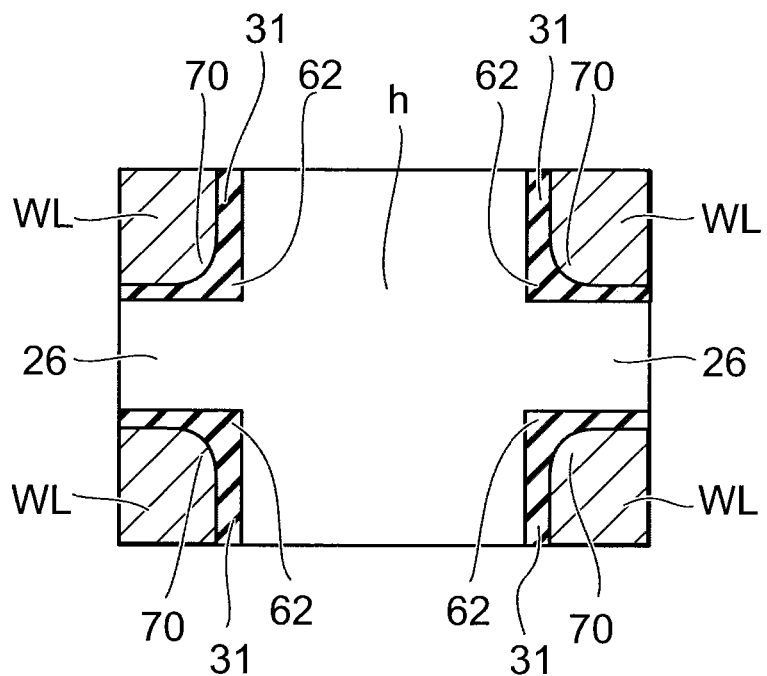

In the formation of the cap film 31, as in the first embodiment, the process is made to proceed to the step shown in FIG. 10A, and thereafter the side of the exposed surface of the electrode layer WL, which is the silicon layer, is nitrided, and the cap film 31, which is the silicon nitride film, is formed on the side of the exposed surface, as shown in FIG. 10B.

For example, by introducing the $NH_3$ gas into the processing room and performing, for 10 minutes, processing by the thermal nitridation method of heating the substrate to 1050° C., it is possible to nitride the electrode layer WL. Alternatively, by introducing the $NH_3$ gas and the gas containing fluorine (for example, the $CF_4$ gas, the $SF_6$ gas or the $NH_6$ gas) into the processing room and performing, for 30 minutes, processing by the plasma nitridation method of heating the substrate to 900° C., it is possible to nitride the electrode layer WL.

When the electrode layer WL is nitrided, the protrusion portion 70 of the electrode layer WL is isotropically exposed, in a plurality of directions, to a gas containing a nitriding seed (N). Hence, in the corner portion 70, the isotropically nitriding reaction is facilitated in a plurality of directions, and, in the cap film 31 formed by the nitriding of the electrode layer WL, the film thickness of the corner portion 62 (a thickness in a direction perpendicular to the interface with the electrode layer WL) can be made larger than the film thickness of the portions other than the corner portion 62. Furthermore, by appropriately controlling the conditions of the nitriding reaction (such as a time and temperature), it is possible to form the corner portion 70 (the interface between the corner portion 70 and the cap film 31) of the electrode layer WL into the shape of a curved surface.

Third Embodiment

Figure 11A:
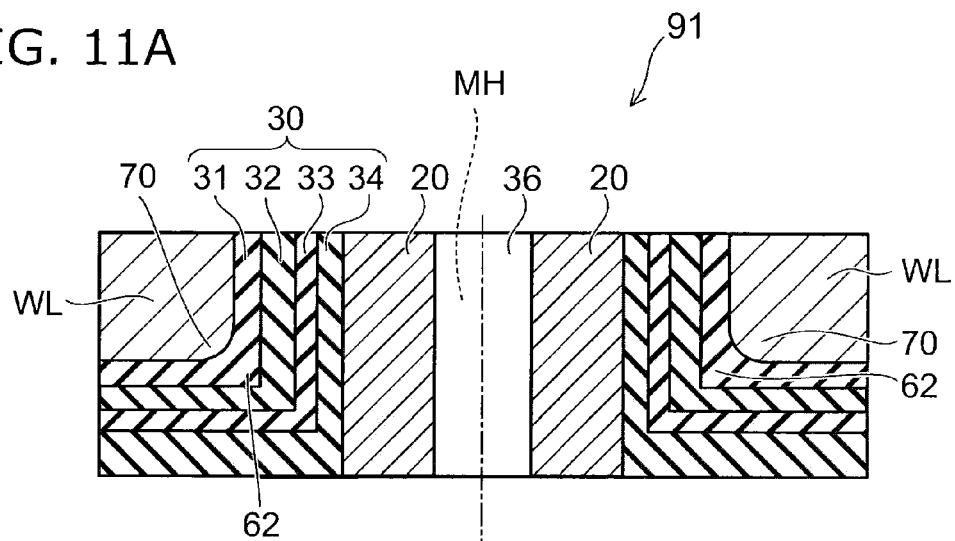
FIGS. 11A and 11B are schematic cross-sectional views of a memory cell according to a third embodiment.
Figure 11B:
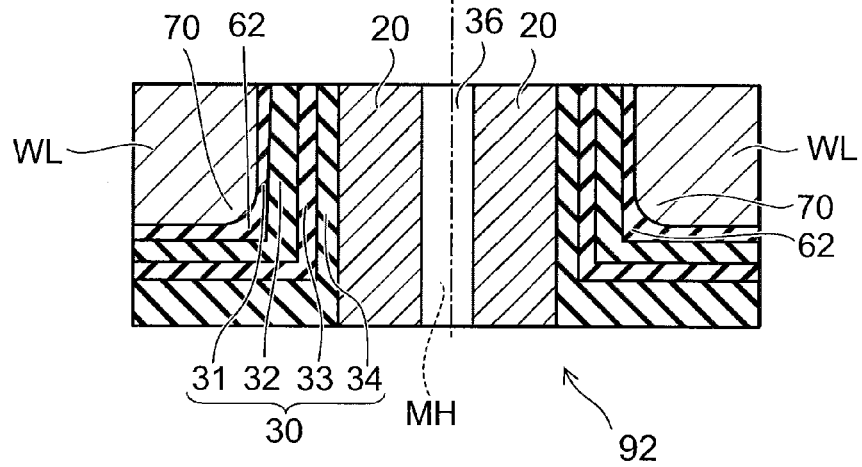

FIGS. 11A and 11B are schematic cross-sectional views of a memory cell according to a third embodiment.

FIG. 11B shows a lower-layer memory cell 92 located on the side of the substrate; FIG. 11A shows an upper-layer memory cell 91 present in a layer higher than the lower-layer memory cell 92. In FIGS. 11A and 11B, the central axis of the memory hole MH common to the upper-layer memory cell 91 and the lower-layer memory cell 92 is represented by an alternate long and short dashed line.

Currently, when the hole penetrating the stacked body described above is formed, it is difficult to form the hole in which the side wall is perpendicular to the surface of the substrate, and, in cross section, the side wall of the hole is easily formed in a shape having a V-shaped tapered part. That is, as the hole deepens, the diameter of the hole tends to gradually decrease, and the diameter of the hole of a lower portion on the side of the substrate in the memory hole MH is less than the diameter of the hole of an upper portion in a position narrower than the lower portion.

As the number of stacked electrode layers WL is increased, and the aspect ratio of the hole is increased, the difference in the diameter of the hole between the upper layer and the lower layer is increased. There is a concern that variations in the diameter of the hole cause the applied electric field to be changed between the upper and lower memory cells, and thus variations are produced in the amount of degradation of the insulating film and an electric charge holding characteristic between the memory cells in writing and a deletion operation.

Specifically, when a voltage is input such that the same tunnel electric field is obtained both in the upper-layer memory cell 91 where the diameter of the hole is relatively large and in the lower-layer memory cell 92 where the diameter of the hole is relatively small, an electric field applied to the block film is relatively increased in the upper-layer memory cell 91, and thus the endurance characteristic is more likely to be degraded.

In the third embodiment, as shown in FIGS. 11A and 11B, the thickness of the cap film 31 around the upper portion of the memory hole MH is made larger than the thickness of the cap film 31 around the lower portion of the memory hole MH. Thus, it is possible to alleviate the difference in the electric field between the upper and lower memory cells, to reduce characteristic variations and to achieve a high reliability.

In the upper portion of the hole which is placed in a position narrower than the lower portion of the hole and in which the diameter of the hole is larger, when the nitriding processing is performed to form the cap film 31, the concentration of nitrogen (or a gas containing nitrogen) becomes higher than that in the lower portion of the hole, and the nitriding reaction is facilitated, with the result that it is possible to form a thicker silicon nitride film (the cap film 31).

According to the embodiment, a method of manufacturing a semiconductor memory device includes: a process of stacking a plurality of electrode layers on a substrate; a process of forming a hole that penetrates the electrode layers in a direction of stacking; and a process of introducing a reactive species of the electrode layers into a side wall on a side of the hole in the electrode layers and a corner portion continuous to the side wall and of forming a cap film on the side wall and the corner portion such that a film thickness of the cap film is larger in the corner portion than in the side wall.

According to the embodiment, the side wall and the corner portion of the electrode layer that is a silicon layer are nitrided such that a silicon nitride film is formed as the cap film.

According to the embodiment, the method of manufacturing the semiconductor memory device further includes a process of forming the hole and thereafter wet etching the electrode layer so as to form, in the side wall and the corner portion, a protrusion portion that protrudes toward the hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a substrate;
a stacked body including a plurality of electrode layers stacked on the substrate via an insulating material, the electrode layers having side surfaces along a stacking direction of the stacked body;
a cap film provided on the side surfaces of the electrode layers and in contact with the electrode layers;
an insulating film provided on a side wall of the cap film and including a charge accumulation film; and
a channel body provided on a side wall of the insulating film,
the cap film including a protrusion portion protruding toward the channel body away from the side surfaces of the electrode layers, and
in the cap film, a film thickness of a portion where the protrusion portion is provided in a direction in which the protrusion portion protrudes being larger than a film thickness of the other portions where the protrusion portion is not provided,
wherein
the cap film is a silicon nitride film, and
the insulating film includes:
a block film provided between the cap film and the charge accumulation film and has a nitrogen concentration lower than the cap film and
a tunnel film provided between the charge accumulation film and the channel body.

2. The device according to claim 1, wherein
the electrode layers include corner portions between the side surfaces and end surfaces in the stacking direction,
the protrusion portion is provided in the corner portions of the electrode layers and
curvature of the corner portions of the electrode layers are lower than a curvature of the protrusion portion.

3. The device according to claim 1, wherein the insulating material between the electrode layers includes the cap film.

4. The device according to claim 3, wherein the insulating material between the electrode layers further includes the charge accumulation film.

5. A semiconductor memory device comprising:
a substrate;
a stacked body including a plurality of electrode layers and a plurality of insulating layers, both of them being alternately stacked on the substrate;
a cap film provided in contact with the electrode layer within a hole formed to penetrate the stacked body;
an insulating film provided on a side wall of the cap film and including a charge accumulation film; and
a channel body provided on a side wall of the insulating film,
the cap film including a protrusion portion protruding toward the insulating film, and in the cap film, a film thickness of a portion where the protrusion portion is provided in a direction in which the protrusion portion protrudes being larger than a film thickness of the other portions where the protrusion portion is not provided, wherein
the cap film is a silicon nitride film, and
the insulating film includes:
a block film provided between the cap film and the charge accumulation film and has a nitrogen concentration lower than the cap film and
a tunnel film provided between the charge accumulation film and the channel body.

6. A semiconductor memory device comprising:
a substrate;
a stacked body including a plurality of electrode layers stacked on the substrate via an insulating material, the electrode layers having side surfaces along a stacking direction of the stacked body;
a cap film provided on the side surfaces of the electrode layers and in contact with the electrode layers, the cap film including a protrusion portion protruding toward the channel body away from the side surfaces of the electrode layers;
an insulating film provided on a side wall of the cap film and including a charge accumulation film; and
a channel body provided on a side wall of the insulating film,
the electrode layers including corner portions between the side surfaces and end surfaces in the stacking direction,
the cap film including corner portions covering the corner portions of the electrode layers,
curvature of the corner portions of the electrode layers being lower than curvature of the corner portions of the cap film, and film thickness of the corner portions of the cap film being larger than film thickness of portions other than the corner portions of the cap film
wherein
the cap film is a silicon nitride film, and
the insulating film includes:
- a block film provided between the cap film and the charge accumulation film and has a nitrogen concentration lower than the cap film and
- a tunnel film provided between the charge accumulation film and the channel body.

7. The device according to claim 6, wherein
the cap film, the insulating film, and the channel body are provided in a hole penetrating the stacked body,
a hole diameter of a lower portion of the hole on a side of the substrate is smaller than a hole diameter of an upper portion in a position narrower than the lower portion, and
a film thickness of the cap film around the upper portion of the hole is larger than a film thickness of the cap film around the lower portion of the hole.

8. The device according to claim 6, wherein the insulating material between the electrode layers includes the cap film.

9. The device according to claim 8, wherein the insulating material between the electrode layers further includes the charge accumulation film.

10. A semiconductor memory device comprising:
a substrate;
a stacked body including a plurality of electrode layers and a plurality of insulating layers, both of them being alternately stacked on the substrate;
a cap film provided in contact with the electrode layer within a hole formed to penetrate the stacked body;
an insulating film provided on a side wall of the cap film and including a charge accumulation film; and
a channel body provided on a side wall of the insulating film,
the electrode layer including a corner portion continuous to an end portion in a direction of thickness,
the cap film including a corner portion covering the corner portion of the electrode layer,
a curvature of the corner portion of the electrode layer being lower than a curvature of the corner portion of the cap film and
a film thickness of the corner portion of the cap film being larger than a film thickness of portions other than the corner portion of the cap film, wherein
the cap film is a silicon nitride film, and
the insulating film includes:
- a block film provided between the cap film and the charge accumulation film and has a nitrogen concentration lower than the cap film and
- a tunnel film provided between the charge accumulation film and the channel body.

* * * * *

UNITED STATES PATENT AND TRADEMARK OFFICE
CERTIFICATE OF CORRECTION

| | |
|---|---|
| PATENT NO. | : 9,209,295 B2 |
| APPLICATION NO. | : 13/601156 |
| DATED | : December 8, 2015 |
| INVENTOR(S) | : Higuchi et al. |

It is certified that error appears in the above-identified patent and that said Letters Patent is hereby corrected as shown below:

On the title page, Items (12) and (75) should read:

--United States Patent
  Higuchi et al.

Inventors:  Masaaki Higuchi, Mie-ken (JP);
              Atsushi Fukumoto, Mie-ken (JP)--

Signed and Sealed this
Seventeenth Day of May, 2016

Michelle K. Lee
*Director of the United States Patent and Trademark Office*